US012787600B2

(12) United States Patent
Yang et al.

(10) Patent No.: US 12,787,600 B2
(45) Date of Patent: Nov. 3, 2026

(54) DISPLAY PANEL, METHOD FOR PREPARING THE SAME AND DISPLAY APPARATUS

(71) Applicants: Yunnan Invensight Optoelectronics Technology Co., Ltd., Yunnan (CN); BOE Technology Group Co., Ltd., Beijing (CN)

(72) Inventors: Chao Yang, Beijing (CN); Zhongxiang Yu, Beijing (CN); Zongshun Yang, Beijing (CN); Ruquan Li, Beijing (CN); Hongtao Yu, Beijing (CN); Dongdong Su, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 390 days.

(21) Appl. No.: 18/694,654

(22) PCT Filed: Nov. 30, 2022

(86) PCT No.: PCT/CN2022/135623
§ 371 (c)(1),
(2) Date: Mar. 22, 2024

(87) PCT Pub. No.: WO2024/113259
PCT Pub. Date: Jun. 6, 2024

(65) Prior Publication Data
US 2025/0127012 A1 Apr. 17, 2025

(51) Int. Cl.
*H10K 59/80* (2023.01)
*H10K 59/12* (2023.01)
(Continued)

(52) U.S. Cl.
CPC ... *H10K 59/80518* (2023.02); *H10K 59/1201* (2023.02); *H10K 59/122* (2023.02); *H10K 2102/351* (2023.02)

(58) Field of Classification Search
CPC ......... H10K 59/80518; H10K 59/1201; H10K 59/122; H10K 2102/351; H10K 2102/3026; H10K 59/124; H10K 59/878; G02F 1/133
See application file for complete search history.

(56) References Cited

U.S. PATENT DOCUMENTS 9,236,419 B2 * 1/2016 Kim ...................... H10K 59/38

FOREIGN PATENT DOCUMENTS

CN 104009186 A 8/2014
CN 104466025 A 3/2015
(Continued)

*Primary Examiner* — Fernando L Toledo
*Assistant Examiner* — Shawn Shaw Muslim
(74) *Attorney, Agent, or Firm* — Workman Nydegger

(57) ABSTRACT

A display panel, a method for preparing the same and a display apparatus are provided. The display panel includes: a base substrate, and a plurality of light-emitting devices at a side of the base substrate. The light-emitting devices each includes a first electrode. The first electrode includes: a reflection portion, and a cover portion at a side of the reflection portion facing away from the base substrate. The cover portion covers a front face and a side face of the reflection portion at the side of the reflection portion facing away from the base substrate. The cover portion includes: a first structural layer, and a second structural layer disposed between the first structural layer and the reflection portion. The second structural layer is configured to block the reflection portion from contacting the first structural layer.

20 Claims, 10 Drawing Sheets

(51) Int. Cl.
*H10K 59/122* (2023.01)
*H10K 102/00* (2023.01)

(56) References Cited

FOREIGN PATENT DOCUMENTS

| | | | |
|---|---|---|---|
| CN | 104701460 | A | 6/2015 |
| CN | 112366279 | A | 2/2021 |
| CN | 114097092 | A | 2/2022 |
| CN | 114335121 | A | 4/2022 |
| CN | 114361222 | A | 4/2022 |

* cited by examiner

DISPLAY PANEL, METHOD FOR PREPARING THE SAME AND DISPLAY APPARATUS

CROSS-REFERENCE TO RELATED APPLICATIONS

The present application is a National Stage of International Application No. PCT/CN2022/135623, filed Nov. 30, 2022, the entire content of which is hereby incorporated by reference.

TECHNICAL FIELD

The present disclosure relates to the field of display technologies, and in particular, to a display panel, a method for preparing a display panel, and a display apparatus.

BACKGROUND

An Organic Light Emitting Diode (OLED) microdisplay adopts the OLED technology and a basic structure of: a first electrode+a light-emitting layer+a second electrode. The first electrode provides holes, the second electrode provides electrons, the holes and electrons combine in the light-emitting layer to form excitons, and the excitons excite the light-emitting layer to emit light. For a top-emitting OLED display, the first electrode needs to be provided with a reflection sub-layer. The reflection sub-layer usually includes an aluminum layer. With the traditional structure of the first electrode, after forming the pattern of the first electrode, a side face of the reflection sub-layer is exposed, which can easily cause the aluminum layer at the side face to migrate and bulge, and to be corroded and lost, thus affecting the efficiency of the injection of the first electrode and the light-emitting efficiency of the OLED, and resulting in increased power consumption. Even large particles will directly short-circuit the second electrode and the first electrode, resulting in a high incidence of point and line defects.

SUMMARY

Embodiments of the present disclosure provide a display panel, including:

- a base substrate; and
- a plurality of light-emitting devices, located at a side of the base substrate.

The light-emitting devices each includes: a first electrode. The first electrode includes: a reflection portion, and a cover portion located at a side of the reflection portion facing away from the base substrate. The cover portion covers a front face and a side face of the reflection portion at the side of the reflection portion facing away from the base substrate. The cover portion includes: a first structural layer, and a second structural layer disposed between the first structural layer and the reflection portion. The second structural layer is configured to block the reflection portion from contacting the first structural layer.

In some embodiments, the reflection portion includes: a third structural layer, a reflection sub-layer and a fourth structural layer stacked at the side of the base substrate. The thickness of the reflection sub-layer is greater than the thickness of the third structural layer. The thickness of the reflection sub-layer is greater than the thickness of the fourth structural layer.

In some embodiments, the reflection portion further includes a first cover layer located at a side of the fourth structural layer facing away from the reflection sub-layer. An orthographic projection of the fourth structural layer on the base substrate covers an orthographic projection of the first cover layer on the base substrate.

In some embodiments, the display panel further includes: a planarization layer disposed between the base substrate and the light-emitting devices. The first electrode is located at a side of the planarization layer away from the base substrate. The cover portion includes a first flat area in contact with the planarization layer.

In some embodiments, the planarization layer includes a first region. An orthographic projection of the first region on the base substrate is located between orthographic projections of adjacent reflection portions on the base substrate.

The first region includes: a first surface facing away from the base substrate and parallel to a plane in which the base substrate is located, and a first side face. The remaining region of the planarization layer outside of the first region includes a second surface facing away from the base substrate and parallel to the plane in which the base substrate is located. The first side face connects the first surface and the second surface.

A distance between the first surface and the base substrate is less than a distance between the second surface and the base substrate.

The orthographic projection of the first flat area on the base substrate is located within the orthographic projection of the first region on the base substrate.

In some embodiments, a distance between the first surface and the second surface is greater than a thickness of the first flat area.

In some embodiments, a distance between the first surface and the second surface is less than a thickness of the reflection portion.

In some embodiments, an included angle between the first side face and the first surface is greater than 90°.

In some embodiments, the display panel further includes a plurality of isolation structures. Orthographic projections of the isolation structures on the base substrate overlap with a region between orthographic projections of adjacent first electrodes on the base substrate.

In some embodiments, the isolation structure includes a first isolation groove structure located in the first region. An orthographic projection of the first isolation groove structure on the base substrate is located between the orthographic projections of the adjacent first electrodes on the base substrate.

In some embodiments, in a direction perpendicular to the base substrate, a depth of the first isolation groove structure is greater than the distance between the first surface and the second surface.

In some embodiments, the display panel further includes a pixel-defining layer.

The pixel-defining layer includes opening areas corresponding the light-emitting devices one by one. An orthographic projection of the opening area on the base substrate falls within an orthographic projection of the corresponding first electrode on the base substrate. The pixel-defining layer covers an edge of the first electrode.

a maximum thickness of the pixel-defining layer is less than a maximum thickness of the first electrode.

In some embodiments, the isolation structure includes a second isolation groove structure.

The display panel further includes a pixel-defining layer. The pixel-defining layer includes the second isolation groove structure. An orthographic projection of the second isolation groove structure on the base substrate is located between the orthographic projection of the adjacent first electrodes on the base substrate.

The pixel-defining layer further includes opening areas corresponding to the light-emitting devices one by one. An orthographic projection of the opening area on the base substrate falls within an orthographic projection of the corresponding first electrode on the base substrate.

In some embodiments, a maximum thickness of the pixel-defining layer is greater than a maximum thickness of the first electrode.

In some embodiments, the pixel-defining layer includes: a first pixel-defining sub-layer, a second pixel-defining sub-layer, and a third pixel-defining sub-layer stacked in a direction perpendicular to the base substrate.

A maximum thickness of the first pixel-defining sub-layer is greater than a maximum thickness of the second pixel-defining sub-layer. The maximum thickness of the second pixel-defining sub-layer is greater than a maximum thickness of the third pixel-defining sub-layer.

The maximum thickness of the first pixel-defining sub-layer is greater than the maximum thickness of the first electrode.

A depth of the second isolation groove structure is greater than a total thickness of the third pixel-defining sub-layer and the second pixel-defining sub-layer and less than the maximum thickness of the pixel-defining layer.

The third pixel-defining sub-layer includes a first opening area. The second pixel-defining sub-layer includes a second opening area. An orthographic projection of the first opening area on the base substrate falls within an orthographic projection of the second opening area on the base substrate.

In some embodiments, an orthographic projection of the first structural layer on the base substrate covers an orthographic projection of the second structural layer on the base substrate.

In some embodiments, the first structural layer includes: a first sub-layer covering the reflection portion, and a second sub-layer located at a side of the first sub-layer facing away from the reflection portion. A thickness of the second sub-layer is greater than a thickness of the first sub-layer.

In some embodiments, an included angle between the side face of the reflection portion and the plane in which the base substrate is located is greater than 0° and less than or equal to 70".

Embodiments of the present disclosure further provide a method for preparing a display panel, including:

- providing a base substrate;
- forming a pattern of a plurality of reflection portions at a side of the base substrate; and
- forming a pattern of a plurality of cover portions at a side of the reflection portions facing away from the base substrate.

The cover portions cover front faces and side faces of the reflection portions at the side of the reflection portions facing away from the base substrate. The cover portions include: a first structural layer, and a second structural layer disposed between the first structural layer and the reflection portions. The second structural layer is configured to block the reflection portions from contacting the first structural layer.

Embodiments of the present disclosure provide a display apparatus, including the display panel provided by the embodiments of the present disclosure.

BRIEF DESCRIPTION OF FIGURES

In order to more clearly illustrate the technical solutions in the embodiments of the present disclosure, the drawings to be used in the description of the embodiments will be briefly introduced below. Obviously, the drawings in the following description are only some embodiments of the present disclosure. Those of ordinary skill in the art can also obtain other drawings based on these drawings without making creative efforts.

DETAILED DESCRIPTION

Figure 1:
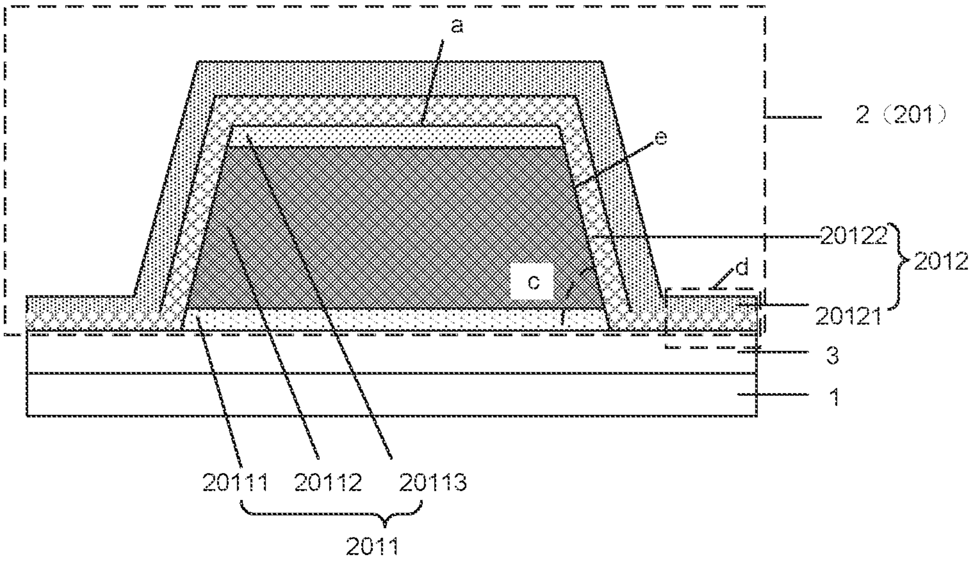
FIG. 1 is a schematic structural diagram of a display panel provided by an embodiment of the present application.

In order to make the purpose, technical solutions and advantages of the embodiments of the present disclosure clearer, the technical solutions of the embodiments of the present disclosure will be clearly and completely described below in conjunction with the drawings of the embodiments of the present disclosure. Apparently, the described embodiments are some but not all of the embodiments of the present disclosure. And in the case of no conflict, the embodiments in the present disclosure and the features in the embodiments can be combined with each other. Based on the described embodiments of the present disclosure, all other embodiments obtained by persons of ordinary skill in the art without creative effort fall within the protection scope of the present disclosure.

Unless otherwise defined, the technical terms or scientific terms used in the present disclosure shall have the usual meanings understood by those skilled in the art to which the present disclosure belongs. “First”, “second” and similar words used in the present disclosure do not indicate any order, quantity or importance, but are only used to distinguish different components. “Comprising” or “including” and similar words mean that the elements or items appearing before the word include the elements or items listed after the word and their equivalents, without excluding other elements or items. Words such as “connected” or “in connection with” are not limited to physical or mechanical connections, but may include electrical connections, whether direct or indirect.

It should be noted that the size and shape of each figure in the drawings do not reflect the true scale, but are only intended to illustrate the present disclosure. And the same or similar reference numerals represent the same or similar elements or elements having the same or similar functions throughout.

In related technology, in a top-emitting OLED display, the first electrode includes a reflection sub-layer and a hole transport sub-layer located on the reflection sub-layer. The reflection sub-layer usually includes an aluminum layer. The process for preparing the traditional first electrode usually adopts a single etching process, i.e., the pattern of the first electrode is formed through the single etching process after layers of the first electrode are deposited. After the pattern of the first electrode is formed, the side face of the reflection sub-layer is exposed, which is easily to cause the aluminum layer at the side face to migrate and bulge, be corroded and lost, and have other defects. One of solutions to avoid causing the aluminum layer to migrate and bulge or be corroded and lost is to use the hole transport sub-layer to cover the side face of the aluminum layer. However, the hole transport sub-layer is usually made of indium tin oxide. The indium tin oxide in direct contact with the side face of the aluminum layer will cause oxygen diffusion to generate an alumina insulating layer at the interface between the hole transport sub-layer and the aluminum layer, significantly affecting the ohmic characteristics and leading to a serious degradation of the performance of the OLED device.

Embodiments of the present disclosure provide a display panel. As shown in FIG. 1, the display panel includes:

a base substrate 1; and a plurality of light-emitting devices 2 located at a side of the base substrate 1.

The light-emitting device 2 includes a first electrode 201. As shown in FIG. 1, the first electrode 201 includes: a reflection portion 2011, and a cover portion 2012 located at a side of the reflection portion 2011 facing away from the base substrate 1. The cover portion 2012 covers a front face ‘a’ and a side face ‘e’ of the reflection portion at the side of the reflection portion 2011 facing away from the base substrate 1. The cover portion 2012 includes: a first structural layer 20121, and a second structural layer 20122 disposed between the first structural layer 20121 and the reflection portion 2011. The second structural layer 20122 is configured to block the reflection portion 2011 from contacting the first structural layer 20121.

In the display panel provided by embodiments of the present disclosure, the first electrode includes a cover portion that covers the side face of the reflection portion, so as to avoid the side face of the reflection portion from migrating and bulging or being corroded and lost, which can improve the flatness of the front face and the side face of the first electrode, improve the injection efficiency of the first electrode, and improve the light-emitting efficiency of the light-emitting device, and thereby reducing the power consumption of the display panel. Moreover, since the cover portion includes the second structural layer disposed between the first structural layer and the reflection portion, the reflection portion can be blocked from contacting the first structural layer. Usually, the first structural layer is made of a metal oxide, and the reflection portion includes a metal material, and an oxide insulating layer will be formed when the first structural layer and the reflection portion are in contact. The second structural layer blocks the reflection portion from contacting the first structural layer, thereby avoiding formation of an oxide insulating layer by the reflection portion contacting the first structural layer, and avoiding affecting the ohmic characteristics of the first electrode and avoiding affecting the performance of the light-emitting device.

Figure 2:
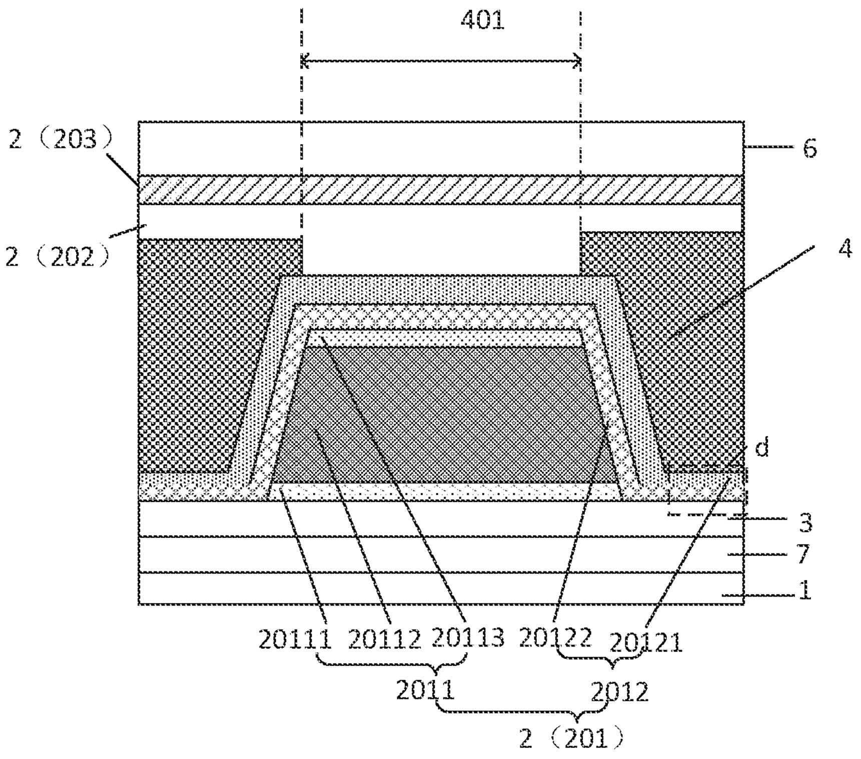
FIG. 2 is another schematic structural diagram of a display panel provided by an embodiment of the present application.

In some embodiments, as shown in FIG. 2, the light-emitting device 2 further includes: a light-emitting functional layer 202 located at a side of the first electrode 201 facing away from the base substrate 1, and a second electrode 203 located at a side of the light-emitting functional layer facing away from the first electrode 201.

In some implementations, the second electrode includes a transparent electrode.

In some implementations, the first electrode is, for example, an anode of the light-emitting device, and the second electrode is, for example, a cathode of the light-emitting device.

It should be noted that in the display panel provided by the embodiments of the present disclosure, the first electrode of the light-emitting device includes a reflection portion in addition to the first structural layer providing holes, and the second electrode is a transparent electrode, i.e., the light-emitting device is a top-emitting light-emitting device. Light emitted from the light-emitting functional layer reaches the reflection portion and is reflected and then emitted from the second electrode.

In some embodiments, as shown in FIG. 1, the reflection portion 2011 includes: a third structural layer 20111, a reflection sub-layer 20112, and a fourth structural layer 20113, which are stacked.

It should be noted that in some implementations, the third structural layer and the fourth structural layer, especially the fourth structural layer, are arranged for protecting the reflection sub-layer. Since the cover portion needs to cover the side face of the reflection portion, a pattern of the reflection portion needs to be formed first, and then a pattern of the covering layer afterwards is formed. The pattern of the reflection portion is usually formed in an etching process. Since the etching process requires the use of an etching solution, arranging the fourth structural layer on the side of the reflection sub-layer facing away from the base substrate can avoid the front face of the reflection sub-layer at the side of the reflection sub-layer facing away from the base substrate from contacting with the etching solution to cause damage.

In some embodiments, as shown in FIG. 1, a shape of the cross-section of the reflection portion 2011 perpendicular to the base substrate 1 is an isosceles trapezoid.

That is, in the display panel provided by embodiments of the present disclosure, the side face of the reflection portion of the first electrode is a bevel with an included angle greater than 0 to the plane in which the base substrate is located, thereby facilitating the cover portion to cover the side face of the reflection portion, so as to protect the side face of the reflection portion, and avoid migration and bulging, or corrosion and missing occurred at the side face of the reflection portion.

In some embodiments, as shown in FIG. 1, the included angle 'c' between the side face of the reflection portion 2011 and the plane where the base substrate 1 is located is greater than 0° and less than or equal to 70°.

In the display panel provided by embodiments of the present disclosure, the included angle between the side face of the reflection portion of the first electrode and the plane in which the base substrate is located is greater than 0" and less than or equal to 70°, i.e., the angle of the included angle is small, which is conducive to the cover portion to form a film continuously on the side face of the reflection portion, so as to protect the side face of the reflection portion, and to avoid the side face of the reflection portion from migrating and bulging, or being corroded and lost.

In some embodiments, an orthographic projection of the first structural layer on the base substrate covers an orthographic projection of the second structural layer on the base substrate.

In some embodiments, the orthographic projection of the first structural layer 20121 on the base substrate 1 coincides with the orthographic projection of the second structural layer 20122 on the base substrate 1 as shown in FIG. 1.

In some implementations, after forming the pattern of the reflection sub-layer, the second structural layer and the first structural layer may be formed sequentially, and then the first structural layer and the second structural layer are subjected to a pattern process to form a pattern of the cover portion. The orthographic projection of the first structural layer on the base substrate coincides with the orthographic projection of the second structural layer on the base substrate. That is, the patterns of the first structural layer and the second structural layer are formed in a single pattern process, which avoids increasing a process for preparing the first electrode while blocking the reflection portion from contacting the first structural layer to form the oxide insulating layer, so as to save costs.

In some embodiments, the second structural layer includes a refractory material.

In the display panel provided by embodiments of the present disclosure, the second structural layer includes a refractory material, so that the second structural layer is less likely to react to form the insulating layer when contacting with the reflection portion, and thus the second structural layer can be used to block the reflection portion from contacting the first structural layer to form the oxide insulating layer.

In some embodiments, the refractory material is, for example, a material having a melting point greater than 1650° C.

In some embodiments, the third structural layer and the fourth structural layer also include a refractory material having a melting point greater than 1650° C.

In the display panel provided by embodiments of the present disclosure, the third structural layer and the fourth structural layer also include the refractory metal material with the melting point greater than 1650° C., so that the third structural layer and the fourth structural layer can protect the reflection sub-layer and avoid damage to the reflection sub-layer. In particular, the fourth structural layer includes the refractory metal material with the melting point greater than 1650° C., thereby preventing the etching solution from contacting the front face of the reflection sub-layer to damage the reflection sub-layer.

In some embodiments, when the second structural layer, the third structural layer, and the fourth structural layer all include a refractory metal material, for example, the second structural layer, the third structural layer and the fourth structural layer include one or a combination of the following materials: titanium (Ti), tungsten (w), molybdenum (Mo), cobalt (Co), chromium (Cr), platinum (Pt), titanium nitride (TIN), titanium tungstenide (TIW).

In some embodiments, the material of the reflection sub-layer 20112 includes: aluminum (AI).

In some embodiments, the first structural layer is a transparent film layer. Thereby, light emitted from the light-emitting functional layer can reach the reflection sub-layer to be reflected.

In some embodiments, the material of the first structural layer includes indium tin oxide (ITO).

In some implementations, the third structural layer, the reflecting sub-layer, and the fourth structural layer arranged stacked and included in the reflection portion are, for example, Ti/Al/Ti or Ti/Al/TIN. The second structural layer and the first structural layer included in the cover portion are, for example, Ti/ITO or TIN/ITO. The reflection portion+cover portion included in the first electrode are, for example, Ti/Al/Ti+Ti/ITO, Ti/Al/TIN+Ti/ITO, Ti/AI/TiN+TIN/ITO or Ti/Al/Ti+TIN/ITO.

It should be noted that, in the display panel provided by the embodiments of the present disclosure, the second structural layer and the fourth structural layer have a poor light transmittance rate. In order to avoid affecting the light transmittance rate of a surface of the light-emitting device facing away from the base substrate, the second structural layer and the fourth structural layer are required to have a thinner thickness.

In some embodiments, a thickness of the first structural layer is greater than a thickness of the second structural layer.

In some embodiments, the thickness of the second structural layer is greater than or equal to 10 angstroms and less than or equal to 15 angstroms.

In some embodiments, a thickness of the reflection sub-layer is greater than either a thickness of the third structural layer or the thickness of the fourth structural layer.

In some embodiments, the thickness of the third structural layer is greater than 50 angstroms.

In some embodiments, a thickness of the fourth structural layer is greater than or equal to 10 angstroms and less than or equal to 15 angstroms.

In some embodiments, a thickness of the reflection sub-layer is greater than or equal to 700 angstroms. Therefore, a reflectivity of the reflection sub-layer can be ensured.

In some embodiments, the thickness of the first structural layer is greater than or equal to 120 angstroms and less than or equal to 100 angstroms. Therefore, the flatness of the front face and side face of the first electrode at the side of the first electrode facing away from the base substrate can be ensured while ensuring the transmittance of the first structural layer.

Figure 3:
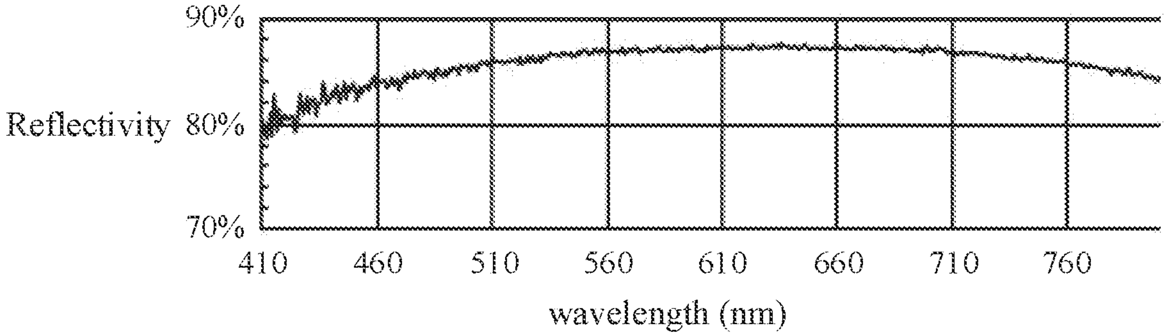
FIG. 3 is a diagram of a reflectivity test result of a display panel provided by an embodiment of the present disclosure.

In some implementations, for example, in a case that the reflection portion+the cover portion included in the first electrode are Ti/Al/TIN+TIN/ITO, the thickness of each film layer is as follows: the thickness of Ti is 100 angstroms, the thickness of Al is 730 angstroms, the thickness of TIN is 10 angstroms, the thickness of TIN is 10 angstroms, and the thickness of ITO is 150 angstroms. The results of the reflectivity test of the above first electrode structure are shown in FIG. 3, and the reflectivity of the first electrode structure for light with a wavelength of 460 nm is 84%, which meets the reflectivity requirement.

Figure 4:
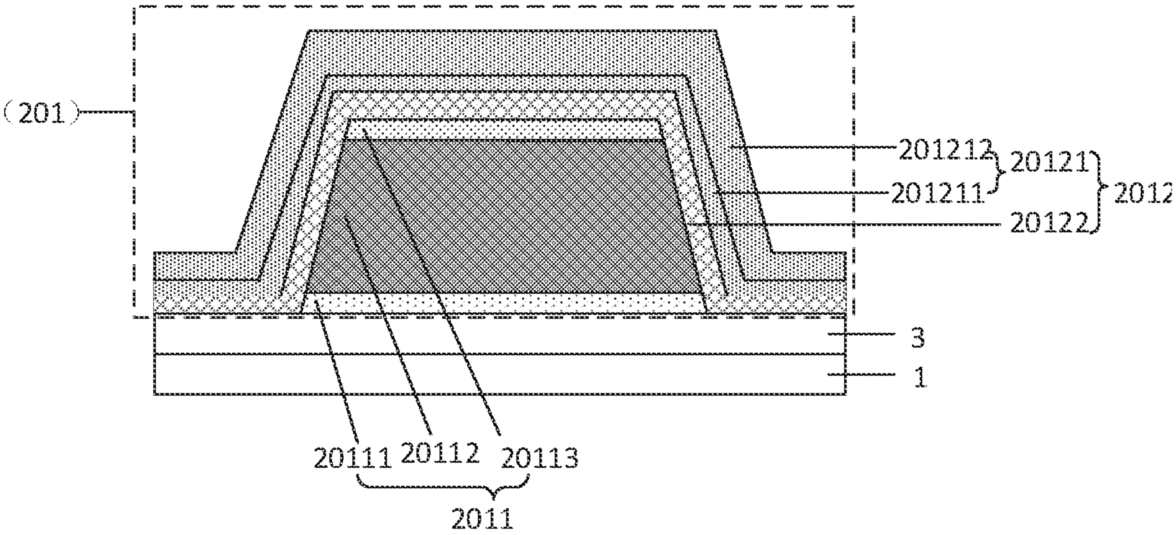
FIG. 4 is another schematic structural diagram of a display panel provided by an embodiment of the present application.

In some embodiments, as shown in FIG. 4, the first structural layer 20121 includes: a first sub-layer 201211 covering the reflection portion, and a second sub-layer 201212 located at a side of the first sub-layer 201211 facing away from the reflection portion.

It should be noted that in order to avoid affecting the light transmittance of the surface of the light-emitting device facing away from the base substrate, the thickness of the second structural layer cannot be too thick. The thinner second structural layer has a poorer thickness uniformity, and accordingly, it will also affect the thickness uniformity of a single first structural layer formed on the second structural layer.

In the display panel provided by embodiments of the present disclosure, the first structural layer includes a first sub-layer and a second sub-layer, that is, the first sub-layer is formed first, and the second sub-layer is formed thereafter. Since the material of the first structural layer can be used to form a thicker film layer while ensuring light transmittance, i.e., the first sub-layer with a thicker thickness can be formed to flatten the front face and the side face of the second structural layer, and then the second sub-layer can be formed at a side of the first sub-layer that has a higher flatness, so that the flatness of the surface of the first electrode can be improved.

In some embodiments, a thickness of the second sub-layer is greater than a thickness of the first sub-layer.

In some embodiments, the thickness of the first structural layer is less than or equal to 200 angstroms;

- the thickness of the first sub-layer is greater than 50 angstroms; and
- the thickness of the second sub-layer is less than 150 angstroms.

Figure 5:
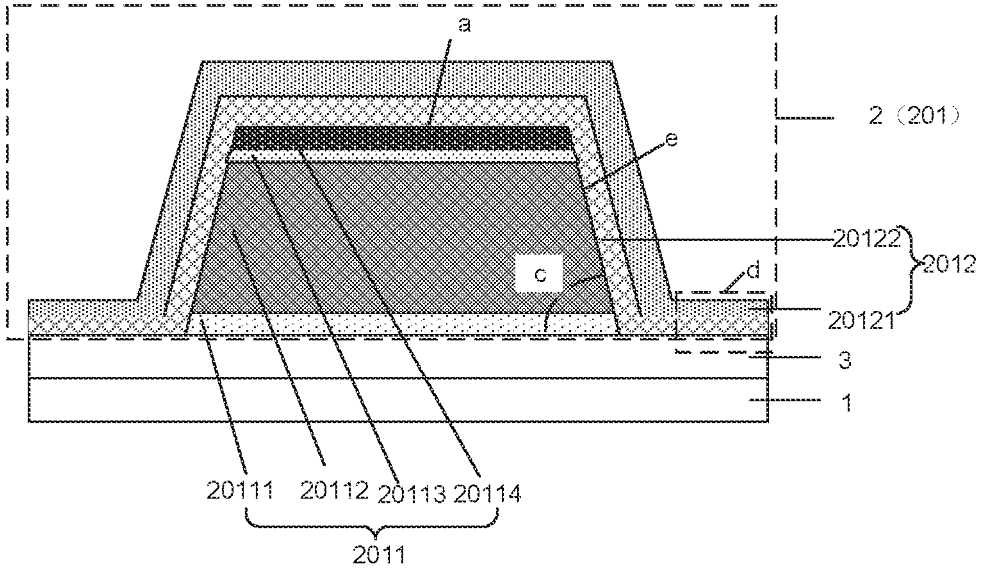
FIG. 5 is another schematic structural diagram of a display panel provided by an embodiment of the present application.

In some embodiments, as shown in FIG. 5, the reflection portion 2011 further includes a first cover layer 20114 located at a side of the fourth structural layer 20113 facing away from the reflection sub-layer 20112.

In some embodiments, a material of the first cover layer includes indium tin oxide.

It should be noted that in order to avoid affecting the light transmittance of the surface of the light-emitting device facing away from the base substrate, the thickness of the fourth structural layer cannot be too thick, the thinner fourth structural layer has a poorer thickness uniformity, and accordingly, it will also affect the thickness uniformity of the cover portion formed on the fourth structural layer.

In the display panel provided by embodiments of the present disclosure, the reflection portion includes a first cover layer covering the fourth structural layer. Since the material of the first cover layer can be used to form a thicker film layer while ensuring the light transmittance rate, i.e., the first cover layer with a thicker thickness can be formed to flatten the fourth structural layer.

In some embodiments, the thickness of the first cover layer is greater than 50 angstroms.

It should be noted that in the related technology, in order to ensure the flatness of the film layer, when the material of the fourth structural layer is TIN, TIN usually needs to be made to have a thickness of about 18 angstroms, and when the material of the fourth structural layer is Ti, Ti usually needs to be made to have a thickness of about 30 angstroms, which affects the light transmission rate. In the display panel provided in embodiments of the present disclosure, as the first cover layer is provided to flatten the fourth structural layer, the thickness of the fourth structural layer can be reduced to 10 angstroms or even less than 10 angstroms, which improves the light transmittance rate of the side of the reflection sub-layer facing away from the base substrate while ensuring the flatness of the surface of the reflection portion.

In some implementations, as shown in FIG. 5, the cross-section of the reflection portion 2011 is an isosceles trapezoid. The first cover layer 20114 covers a surface of the fourth structural layer 20113 facing away from the base substrate 1. The orthographic projection of the fourth structural layer 20113 on the base substrate 1 covers an orthographic projection of the first cover layer 20114 on the base substrate 1.

It should be noted that a single first structural layer is provided in the cover portion in FIG. 5 as an example for illustration. Of course, in some implementation, it is also possible to form the first structural layer in FIG. 5 in two stages, i.e., the first structural layer includes a first sub-layer and a second sub-layer.

In some implementations, the display panel provided by embodiments of the present disclosure may be a micro organic light-emitting diode (Micro OLED) display panel.

In some implementations, the base substrate of the Micro OLED display panel is, for example, a silicon-based substrate. As shown in FIG. 2, the display panel further includes: a planarization layer 3 disposed between the base substrate 1 and the light-emitting devices 2, and a driving circuit layer 7 disposed between the base substrate 1 and the planarization layer 3. Herein the material of the planarization layer includes, for example, silicon oxide. The driving circuit layer is, for example, an integrated circuit. The driving circuit layer includes pixel driving circuits electrically connected with the light-emitting devices one by one. The pixel driving circuits may, for example, include complementary metal oxide semiconductor transistors.

In some implementations, the driving circuit layer of the Micro OLED display panel adopts an integrated circuit including complementary metal oxide semiconductor transistors, and the size of the pixel driving circuit is smaller, so that the resolution of the display panel can be increased, and a resolution of the Micro OLED display panel being greater than 3000 pixel density (PPI) can be achieved. That is, the display panel provided by embodiments of the present disclosure is a display panel with a high resolution.

In some embodiments, as shown in FIG. 2, the first electrode 201 is located at a side of the planarization layer 3 away from the base substrate 1.

As shown in FIG. 1, the cover portion 2012 includes a first flat area 'd' covering the planarization layer 3.

In some embodiments, as shown in FIG. 2, the display panel further includes a pixel-defining layer 4. The pixel-defining layer 4 includes opening areas 401 that correspond with the light-emitting devices 2 one by one. An orthographic projection of the opening area 401 on the base substrate 1 falls within the orthographic projection of the first electrode 201 on the base substrate 1. That is, the opening area 401 is the light-emitting area of a corresponding light-emitting device 2.

In some embodiments, as shown in FIG. 2, the display panel further includes: an encapsulation layer 6 located at the side of the light-emitting device 2 facing away from the base substrate 1.

In some implementations, the encapsulation layer includes, for example, an inorganic encapsulation layer/organic encapsulation layer/inorganic encapsulation layer arranged in stacked layers.

In some implementations, the display panel includes a plurality of sub-pixels. Each sub-pixel includes a light-emitting device.

Figure 6:
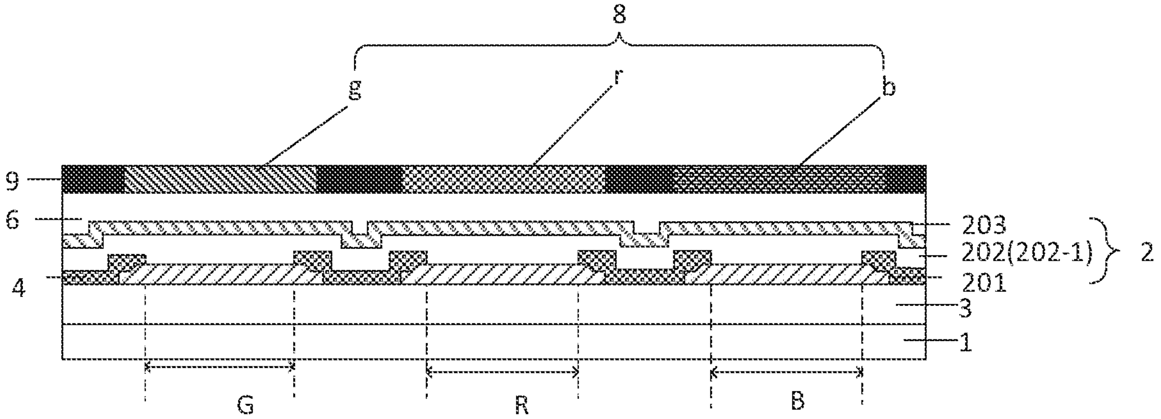
FIG. 6 is another schematic structural diagram of a display panel provided by an embodiment of the present application.

In some embodiments, as shown in FIG. 6, the light-emitting device 2 is a white light-emitting device. The display panel further includes: color filters 8 located at the side of the light-emitting device 2 facing away from the base substrate, and a light-shielding layer 9 disposed between adjacent color filters 8.

It should be noted that due to that the resolution of the Micro OLED display panel is high, and the traditional fine metal mask (FMM) can at most achieve a resolution of about 800 PPI, so it is difficult to use the FMM in a side-by-side monochrome device (SBS) way for the vapor-deposition of the organic light-emitting layer. Therefore, when the light-emitting device is a white light-emitting device, the whole surface vapor deposition process can be used to achieve a high resolution display. The display panel also includes color filters, so that the light emitted by the white light-emitting device and passed through the color filter can be emitted out with the same color as the sub-pixel, so as to achieve a full-color display.

In some implementations, as shown in FIG. 6, the plurality of sub-pixels include, for example, a plurality of blue sub-pixels B, a plurality of red sub-pixels R, and a plurality of green sub-pixels G. Accordingly, the color filters 8 includes: blue color filters corresponding to the blue sub-pixels B, red color filters corresponding to the red sub-pixels R, and green color filters corresponding to the green sub-pixels G.

In some implementations, the light-emitting functional layer includes at least one light-emitting unit, and the light-emitting unit includes an organic light-emitting layer.

In some implementations, as shown in FIG. 6, the light-emitting functional layer 202 of the light-emitting device 2 includes only one light-emitting unit. That is, the light-emitting device uses a single organic light-emitting layer structure to achieve white light emission. The organic light-emitting layer, for example, uses a combination of multiple different light-emitting materials to achieve white light.

Figure 7:
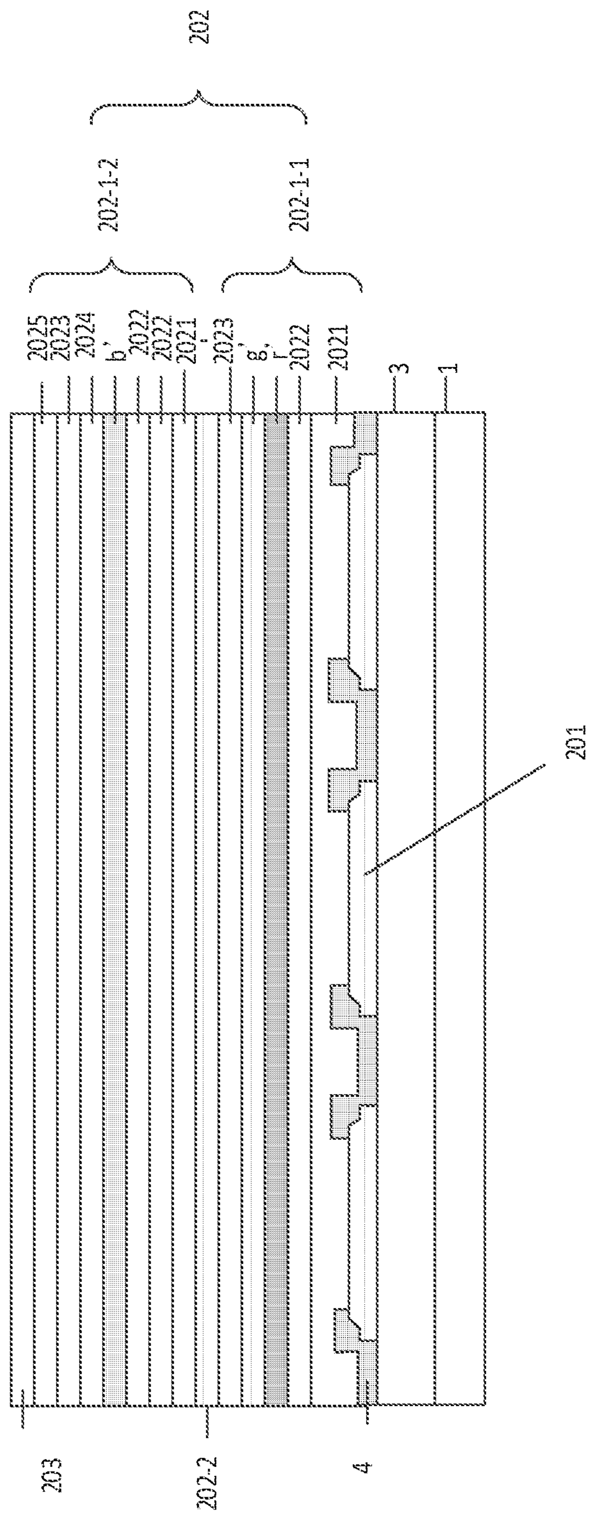
FIG. 7 is another schematic structural diagram of a display panel provided by an embodiment of the present application.

Alternatively, in some embodiments, as shown in FIG. 7, the light-emitting functional layer 202 includes a plurality of light-emitting units 202-1, and a charge generation layer 202-2 disposed between the light-emitting units 202-1. The plurality of light-emitting units 202-1 are disposed in stacked layers between the first electrode 201 and the second electrode 203.

It should be noted that for the case where the light-emitting device includes only one light-emitting unit, a single organic light-emitting layer is used to achieve white light, and the light emission brightness of the light-emitting device is usually not high. If a display panel including this light-emitting device is used to achieve a high brightness display, the power consumption of the display panel needs to be increased, which affects the life of the display panel.

In the display panel provided by the embodiments of the present disclosure, the light-emitting device includes the plurality of light-emitting units, each of which includes an organic light-emitting layer, so that the light emitted by the light-emitting device has an effect of the superposition of the plurality of light-emitting units, which can increase the brightness of the light-emitting device, so that the power consumption of the display panel can be reduced, and the service life of the display panel can be improved.

It should be noted that the light-emitting device 2 including two light-emitting units 202-1 arranged in stacked layers is taken as an example in FIG. 7. In some embodiments, as shown in FIG. 7, the light-emitting device 2 includes: a first light-emitting unit 202-1-1, and a second light-emitting unit 202-1-2 located at a side of the first light-emitting unit 202-1-1 facing away from the base substrate 1.

The first light-emitting unit 202-1-1 includes: a red light organic light-emitting layer r', and a green light organic light-emitting layer g' located at a side of the red light organic light-emitting layer r' facing away from the base substrate 1.

The second light-emitting unit 202-1-2 includes: a blue light organic light-emitting layer b'.

In some implementations, the charge generation layer is used to generate electrons and holes, thereby providing electrons to the first light-emitting unit and providing holes to the second light-emitting unit.

In some embodiments, as shown in FIG. 7, the first light-emitting unit 202-1-1 further includes: a hole-injection layer 2021 disposed between the red light organic light-emitting layer r' and the first electrode 201, a hole transport layer 2022 disposed between the red light organic light-emitting layer r' and the hole-injection layer 2021, and an electron transport layer 2023 disposed between the green light organic light-emitting layer g' and the charge generation layer 202-2. The second light-emitting unit 202-1-2 further includes: a hole injection layer 2021 disposed between the blue light organic light-emitting layer b' and the charge generation layer 202-2, two hole transport layers 2022 disposed between the blue light organic light-emitting layer b' and the hole injection layer 2021, an electron transport layer 2023 disposed between the blue light organic light-emitting layer b' and the second electrode 203, a hole blocking layer 2024 disposed between the blue light organic light-emitting layer b' and the electron transport layer 2023, and an electron injection layer 2025 disposed between the electron transport layer 2023 and the second electrode 203.

In some implementations, the hole injection layer, the hole transport layer, the electron transport layer, the hole blocking layer, the electron injection layer, and the charge generation layer may be prepared using a whole surface vapor deposition process.

In some embodiments, the hole injection layer, the hole transport layer, the electron transport layer, the hole blocking layer, the electron injection layer, and the charge generation layer corresponding to different sub-pixels may be integrally connected, i.e., the hole injection layer, the hole transport layer, the electron transport layer, the hole blocking layer, the electron injection layer and the charge generation layer are common layers.

Figure 9:
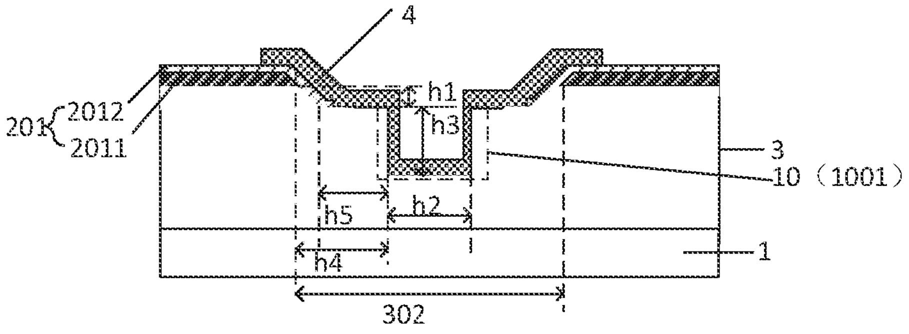
FIG. 9 is another schematic structural diagram of a display panel provided by an embodiment of the present application.
Figure 10:
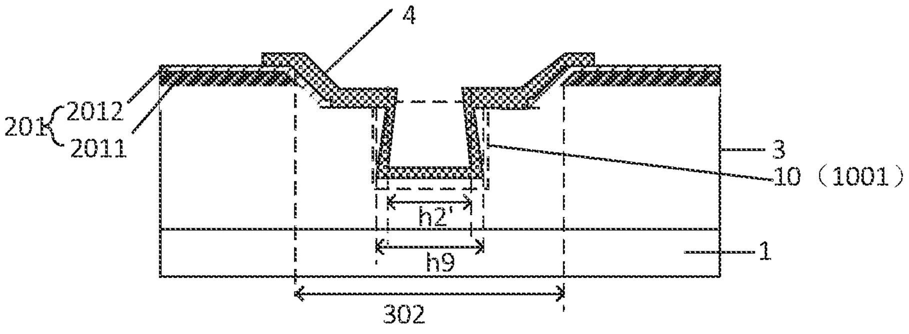
FIG. 10 is another schematic structural diagram of a display panel provided by an embodiment of the present application.
Figure 11:
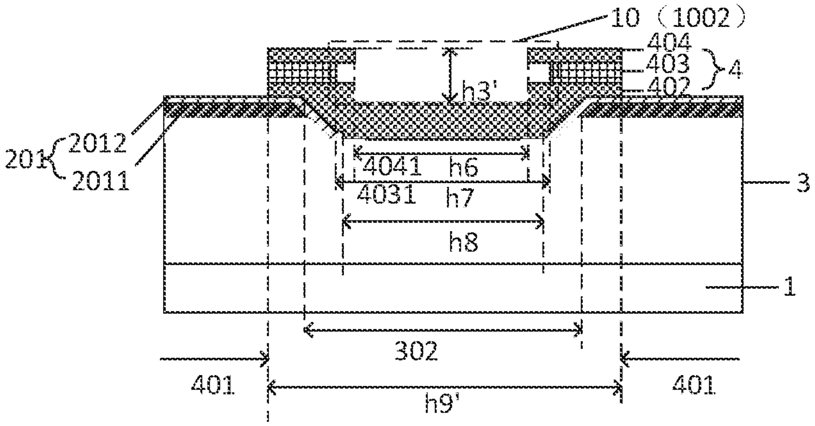
FIG. 11 is another schematic structural diagram of a display panel provided by an embodiment of the present application.

Alternatively, in some embodiments, as shown in FIGS. 9-11, the display panel further includes a plurality of isolation structures 10. The orthographic projection of the isolation structure 10 on the base substrate 1 overlaps with a region between orthographic projections of adjacent first electrodes 201 on the base substrate 1.

In some implementations, the isolation structure is located in a region between light-emitting areas of the sub-pixels, for making the charge generation layer formed by whole surface vapor deposition to be disconnected at the isolation structure.

It should be noted that the charge generation layer has a large lateral conductivity. If the charge generation layer is continuous between adjacent sub-pixels, it is likely to lead to a problem of color crosstalk emerging between the sub-pixels. The display panel provided by embodiments of the present disclosure is provided with the isolation structures that cause the charge generation layer formed by whole surface vapor deposition to be disconnected at the isolation structures, so as to avoid the problem of color crosstalk between sub-pixels.

In some implementations, the isolation structure may be, for example, a tall fence (TF), a dig on wafer (DOW) between pixels, an undercut, and the like.

In some embodiments, as shown in FIG. 8, FIG. 9, FIG. 10, and FIG. 11, the planarization layer 3 includes a first region 302. An orthographic projection of the first region 302 on the base substrate 1 is located between the orthographic projections of the adjacent first electrodes 201 on the base substrate 1.

Figure 8:
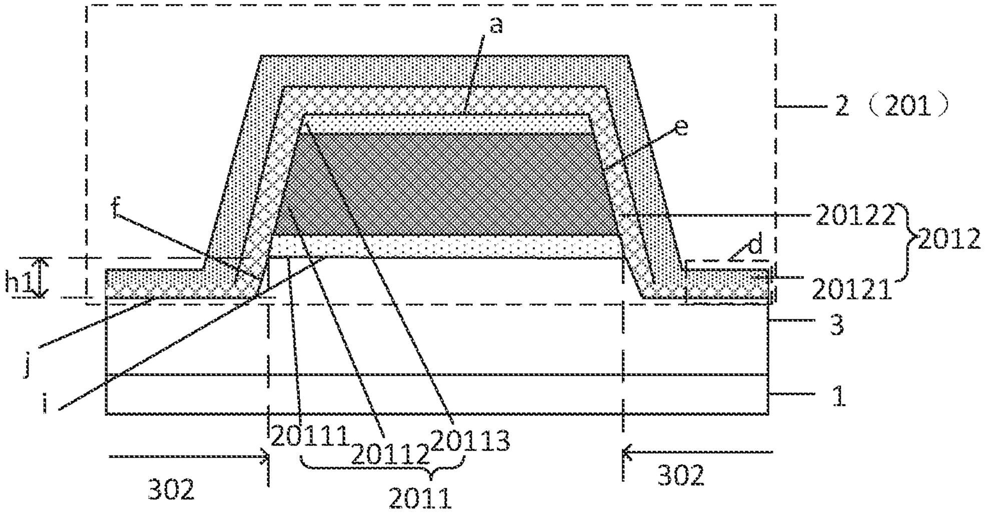
FIG. 8 is another schematic structural diagram of a display panel provided by an embodiment of the present application.

In some embodiments, as shown in FIG. 8, the first region 302 includes: a first surface 'j' parallel to the plane in which the base substrate 1 is located, and a first side face 'f'. The remaining region of the planarization layer 3 outside of the first region 302 includes a second surface 'I' facing away from the base substrate 1 and parallel to the plane in which the base substrate 1 is located. The first side face 'f' connects the first surface j and the second surface 'i'.

The distance between the first surface 'j' and the base substrate 1 is less than the distance between the second surface 'i' and the base substrate 1.

It should be noted that in the process of forming the reflection portion, the etching process needs to be performed on the fourth structural layer, the reflection sub-layer, and the third structural layer. In order to avoid the existence of etching residues on the fourth structural layer, the reflection sub-layer, and the third structural layer, an over-etching process is required, i.e., a part of the planarization layer is removed while the fourth structural layer, the reflection sub-layer, and the third structural layer are etched. In other words, the planarization layer has a first region where a part of the planarization layer has been removed by the over-etching process. Then an isolation groove structure is formed in the first region as an isolation structure.

In some embodiments, as shown in FIG. 8, the distance between the first surface 'j' and the second surface 'i' is greater than a thickness of the first flat area 'd' of the cover portion 2012.

In some embodiments, as shown in FIG. 8, the distance between the first surface 'j' and the second surface 'i' is less than a thickness of the reflection portion 2011.

In some embodiments, an included angle between the first side face 'f' and the first surface 'j' is greater than 90", as shown in FIG. 8.

In some implementations, the included angle between the first side face and the first surface may be equal to an included angle between the side face of the reflection portion and the first surface.

In some implementations, h1 is greater than or equal to 200 angstroms and less than or equal to 300 angstroms.

In some embodiments, as shown in FIG. 8, an orthographic projection of the first flat area on the base substrate 1 is located within the orthographic projection of the first region 302 on the base substrate 1. That is, the cover portion extends to cover a region (i.e., the first region) of the planarization layer where a part of the planarization layer has been removed by the over-etching process, to improve the covering effect of the cover portion.

In some embodiments, the isolation structure is an isolation groove structure formed by DOW. As shown in FIG. 9, the isolation structure 10 includes a first isolation groove structure 1001. The first isolation groove structure 1001 is located in the first region 302. An orthographic projection of the first isolation groove structure 1001 on the base substrate 1 is located between the orthographic projections of the adjacent first electrodes 201 on the base substrate 1. That is, the first isolation groove structure 1001 is formed in the first region 302 of the planarization layer 3.

In some implementations, the first isolation groove structure is formed at the planarization layer, and the pixel-defining layer formed subsequently also forms a groove structure at the isolation groove structure, such that the charge generation layer formed by the whole surface vapor deposition process is disconnected at the region corresponding to the first isolation groove structure.

In some embodiments, as shown in FIG. 9, a depth h3 of the first isolation groove structure 1001 is greater than a distance h1 between the first surface and the second surface in a direction perpendicular to the base substrate.

In some implementations, the depth h3 of the first isolation groove structure is, for example, greater than or equal to 600 angstroms and less than or equal to 1200 angstroms.

In some implementations, as shown in FIG. 9, a width of the first region 302 is, for example, 1 micron to 1.2 microns. A width h2 of the first isolation groove structure 1001 is, for example, greater than or equal to 0.45 microns and less than or equal to 0.55 microns. A distance h5 between the first isolation groove structure 1001 and an edge of the first surface is, for example, 0.15 microns. A distance h4 between the first isolation groove structure 1001 and an edge of the second surface is, for example, 0.3 microns.

In some embodiments, the pixel-defining layer 4 covers an edge of the first electrode 201 as shown in FIG. 9.

In some embodiments, a maximum thickness of the pixel-defining layer is less than a maximum thickness of the first electrode.

In some implementations, the thickness of the pixel-defining layer is less than the thickness of the first electrode. For example, the ratio of the thickness of the pixel-defining layer to the thickness of the first electrode is greater than or equal to ⅓ and less than or equal to ½.

In some embodiments, as shown in FIG. 9, the orthographic projection of the first isolation groove structure 1001 on the base substrate 1 is located within the orthographic projection of the first region 302 on the base substrate 1.

In some embodiments, as shown in FIG. 9, a shape of a cross-section of the first isolation groove structure 1001 perpendicular to the base substrate 1 is rectangular, i.e., the side faces of the first isolation groove structure 1001 are perpendicular to the bottom surface of the first isolation groove structure 1001.

Of course, in some implementations, the shape of the cross-section of the first isolation groove structure 1001 perpendicular to the base substrate 1 is non-rectangular, as shown in FIG. 10. For example, the shape is an inverted trapezoidal shape in FIG. 10. A width of the cross-section of the first isolation groove structure 1001 perpendicular to the base substrate 1 gradually decreases in a direction away from the base substrate 1. That is, in FIG. 10, the width h2' of the first isolation groove structure 1001 at a place that is furthest away from the base substrate 1 is smaller than a width h9 of the first isolation groove structure 1001 at a place that is closest to the base substrate 1. The shape of the cross-section of the first isolation groove structure perpendicular to the base substrate 1 is an inverted trapezoidal shape, which is more conducive to the charge generation layer being disconnected at the first isolation groove structure.

Alternatively, in some embodiments, the isolation structure is an isolation groove structure formed by undercut, as shown in FIG. 11. The isolation structure 10 includes a second isolation groove structure 1002. The pixel-defining layer 4 includes the second isolation groove structure 1002. An orthographic projection of the second isolation groove structure 1002 on the base substrate 1 is located between the orthographic projections of the adjacent first electrodes 201 on the base substrate 1.

In some embodiments, as shown in FIG. 11, the maximum thickness of the pixel-defining layer 4 is greater than the maximum thickness of the first electrode 201.

In some embodiments, as shown in FIG. 11, the pixel-defining layer 4 includes: a first pixel-defining sub-layer 402, a second pixel-defining sub-layer 403, and a third pixel-defining sub-layer 404 which are stacked in the direction perpendicular to the base substrate 1.

A maximum thickness of the first pixel-defining sub-layer 402 is greater than a maximum thickness of the second pixel-defining sub-layer 403, and a maximum thickness of the second pixel-defining sub-layer 403 is greater than a maximum thickness of the third pixel-defining sub-layer 404.

The maximum thickness of the first pixel-defining sub-layer 402 is greater than the maximum thickness of the first electrode 201.

A depth h3' of the second isolation groove structure 1002 is greater than a total thickness of the third pixel-defining sub-layer 404 and the second pixel-defining sub-layer 403 and less than the maximum thickness of the pixel-defining layer 4.

That is, the second isolation groove structure penetrates through the third pixel-defining sub-layer as well as the second pixel-defining sub-layer, but does not penetrate through the first pixel-defining sub-layer. The first pixel-defining sub-layer is only partially removed in the direction perpendicular to the base substrate in a region where the second isolation groove structure is located.

In some embodiments, as shown in FIG. 11, the third pixel-defining sub-layer 404 includes a first opening area 4041, and the second pixel-defining sub-layer 403 includes a second opening area 4031. A width h6 of the first opening area 4041 is smaller than a width h7 of the second opening area 4031. That is, an orthographic projection of the first opening area 4041 on the base substrate 1 falls within an orthographic projection of the second opening area 4031 on the base substrate 1. Thus, it is more conducive to disconnect the charge generation layer.

In some implementations, for example, the width h6 of the first opening area 4041 is smaller than a width h8 between the adjacent first electrodes 201, and the orthographic projection of the first opening area 4041 on the base substrate 1 falls into the region between the orthographic projections of the adjacent first electrodes 201 on the base substrate 1. The width h7 of the second opening area 4031 is larger than the width h8 between the adjacent first electrodes 201.

In some implementations, h8 is, for example, greater than or equal to 0.78 microns and less than or equal to 0.88 microns; h6 is, for example, greater than or equal to 0.43 microns and less than or equal to 0.53 microns; h7-h6 is, for example, greater than or equal to 0.08 microns and less than or equal to 0.12 microns; and h3' is, for example, greater than or equal to 800 angstroms and less than or equal to 1000 angstroms. A width h9' between adjacent opening areas 401 in FIG. 11 is greater than or equal to 1.7 microns and less than or equal to 1.8 microns.

In some implementations, materials of the first pixel-defining sub-layer and the third pixel-defining sub-layer include silicon oxide, and a material of the second pixel-defining sub-layer includes silicon nitride.

Figure 12:
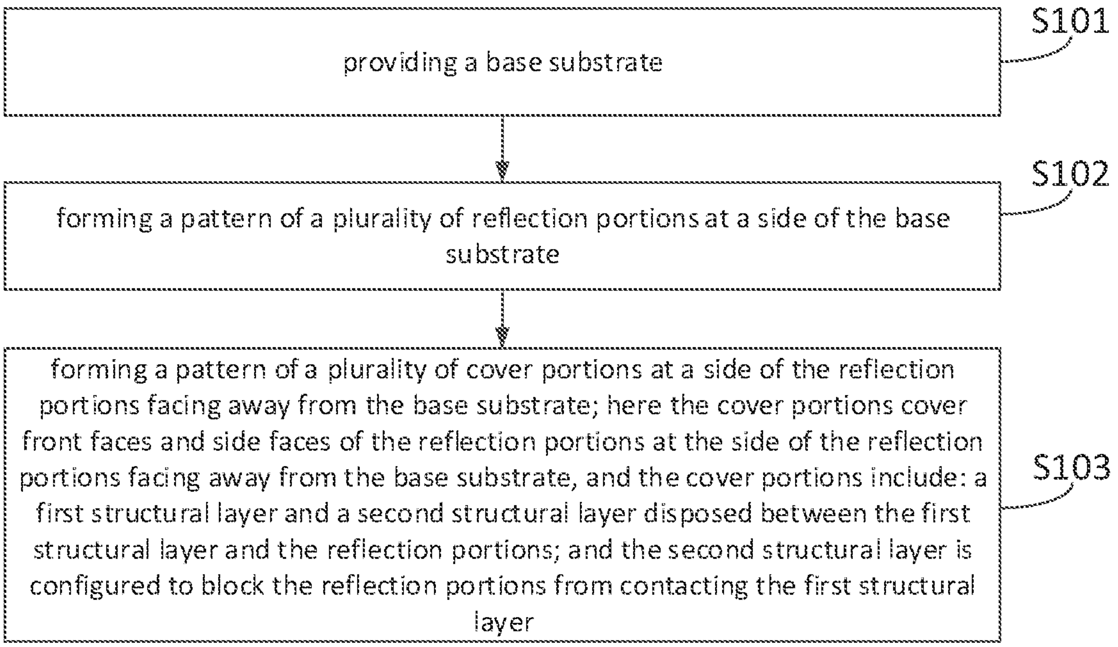
FIG. 12 is a schematic flow chart of a method for preparing a display panel provided by an embodiment of the present application.

Based on the same inventive concept, embodiments of the present disclosure provide a method for preparing a display panel, as shown in FIG. 12, including:

- S101, providing a base substrate;
- S102, forming a pattern of a plurality of reflection portions at a side of the base substrate; and
- S103, forming a pattern of a plurality of cover portions at a side of the reflection portions facing away from the base substrate.

The cover portion covers a front face and a side face of the reflection portion at the side of the reflection portion facing away from the base substrate. The cover portion includes: a first structural layer and a second structural layer disposed between the first structural layer and the reflection portion. The second structural layer is configured to block the reflection portion from contacting the first structural layer.

In the method for preparing the display panel provided by embodiments of the present disclosure, when fabricating the first electrode, a pattern of the reflection portion is formed first, and then the cover portion covering the front face and the side face of the reflection portion is formed, to avoid migration and bulging or corrosion and missing on the side face of the reflection portion, improve the flatness of the front face of the first electrode, improve the injection efficiency of the first electrode, and improve the light-emitting efficiency of the light-emitting device, and thereby reducing the power consumption of the display panel. Moreover, since the cover portion includes a second structural layer disposed between the first structural layer and the reflection portion, the reflection portion can be blocked from contacting the first structural layer to form an oxide insulating layer, which can avoid affecting the ohmic characteristics of the first electrode and avoid affecting the light-emitting device performance.

Figure 13:
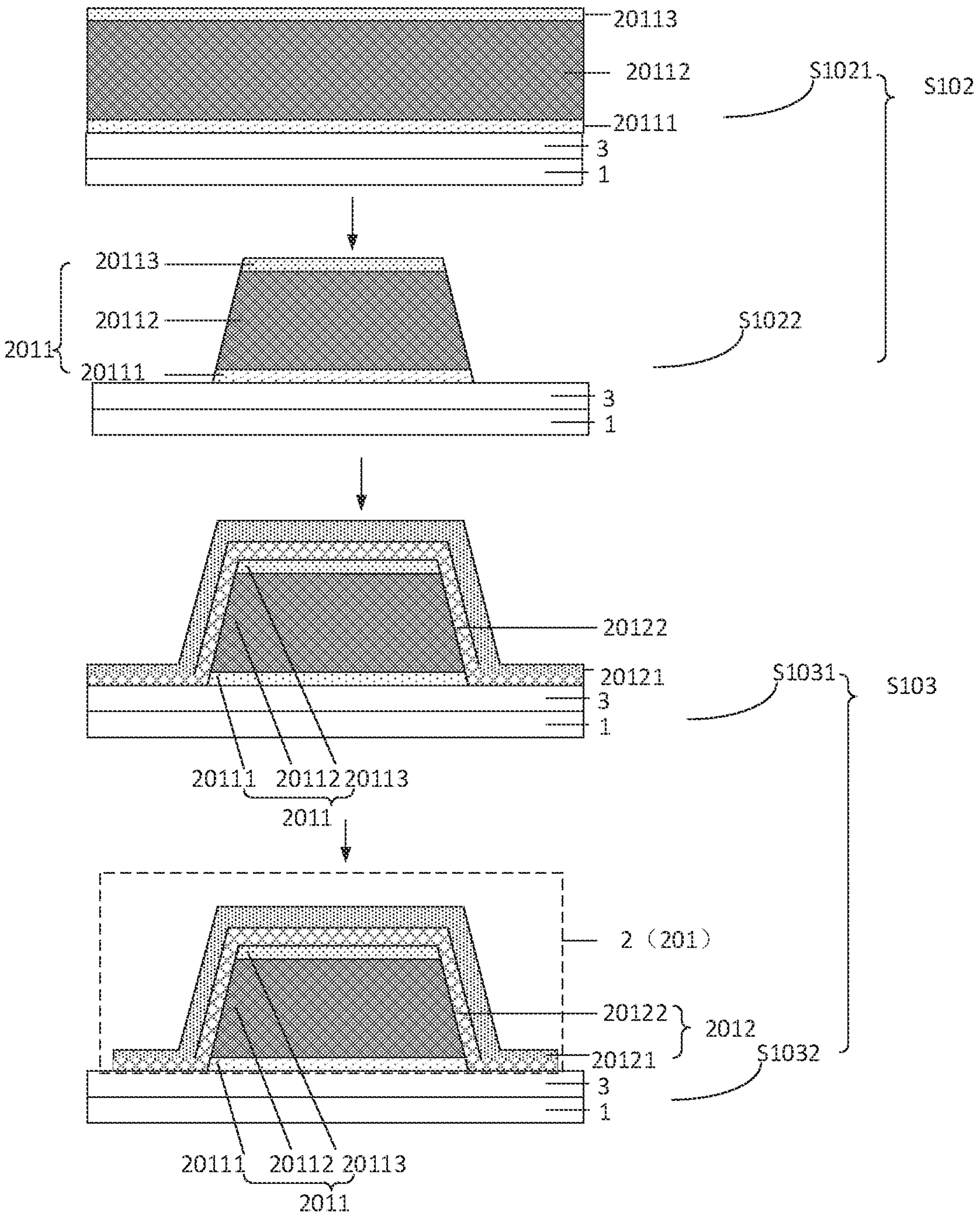
FIG. 13 is another schematic flow chart of a method for preparing a display panel provided by an embodiment of the present application.

In some embodiments, as shown in FIG. 13, the operation S102 of the forming the pattern of the plurality of reflection portions at the side of the base substrate, includes:

- S1021, forming a third structural layer 20111, a reflection sub-layer 20112 and a fourth structural layer 20113 in sequence at the side of the base substrate 1; and
- S1022, forming the pattern of the plurality of reflection portions 2011 by performing an etching process on the fourth structural layer 20113, the reflection sub-layer 20112 and the third structural layer 20111.

Figure 14:
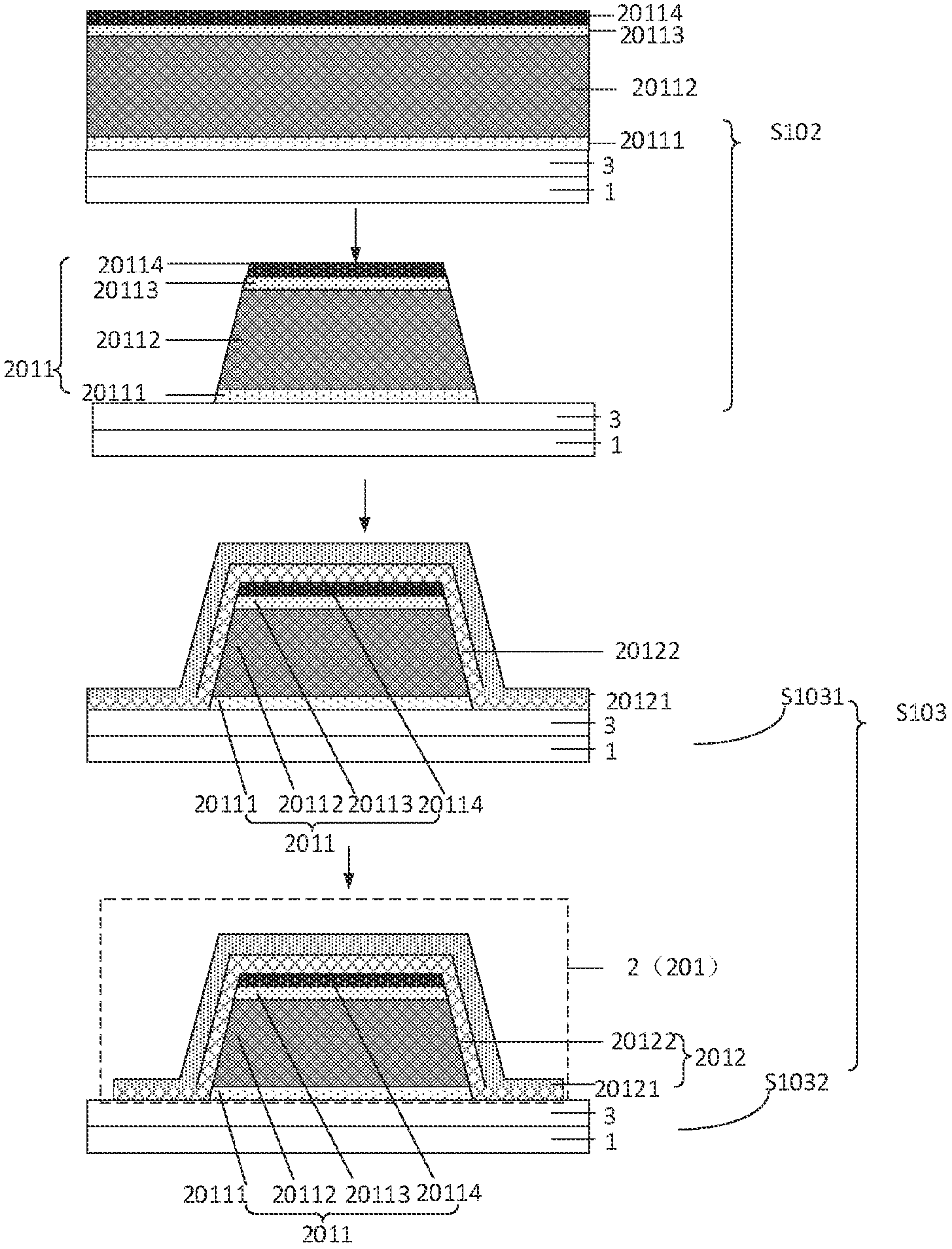
FIG. 14 is another schematic flow chart of a method for preparing a display panel provided by an embodiment of the present application.

In some embodiments, as shown in FIG. 14, after sequentially forming the third structural layer 20111, the reflection sub-layer 20112 and the fourth structural layer 20113 at the side of the base substrate 1, the method further includes:

- forming a first cover layer 20114 on a side of the fourth structural layer 20113 facing away from the reflection sub-layer 20112.

The forming the pattern of the plurality of reflection portions 2011 by performing the etching process on the fourth structural layer 20113, the reflection sub-layer 20112 and the third structural layer 20111, includes:

- forming the pattern of the plurality of reflection portions 2011 by performing the etching process on the first cover layer 20114, the fourth structural layer 20113, the reflection sub-layer 20112, and the third structural layer 20111.

In some embodiments, as shown in FIG. 13, the operation S103 of the forming the pattern of the plurality of cover portions on the side of the reflection portions facing away from the base substrate, includes:

- S1031, forming a second structural layer 20122 at the side of the reflection portion 2011 facing away from the base substrate 1, and forming a first structural layer 20121 at a side of the second structural layer 20122 facing away from the base substrate; and S1032, forming the pattern of the plurality of cover portions 2012 by patterning the first structural layer 20121 and the second structural layer 20122.

In some embodiments, a single ITO layer is formed as the first structural layer 20121 at the side of the second structural layer 20122 facing away from the base substrate, as shown in FIG. 13.

Figure 15:
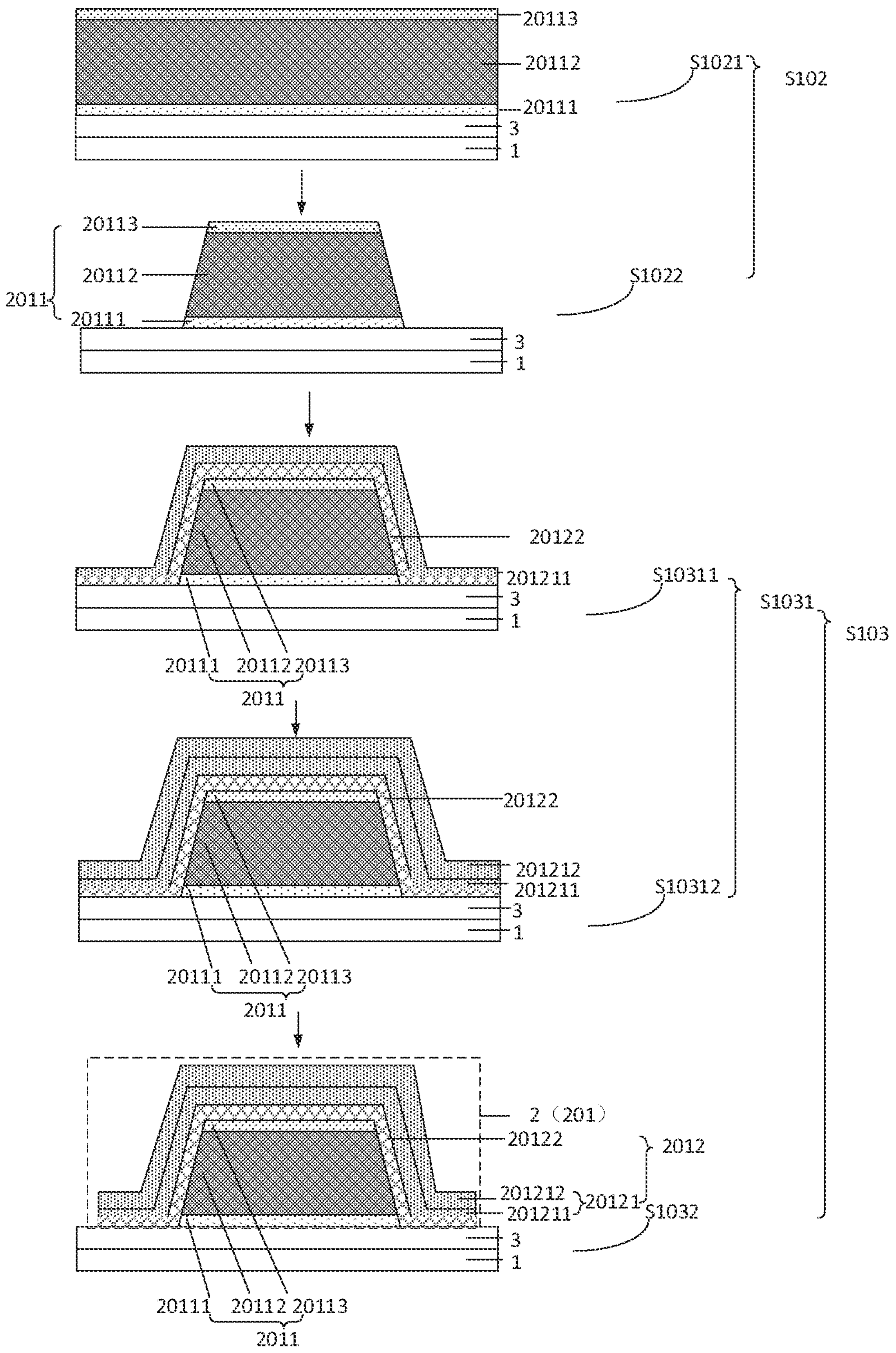
FIG. 15 is another schematic flow chart of a method for preparing a display panel provided by an embodiment of the present application.

Alternatively, in some embodiments, as shown in FIG. 15, the operation S1031 of the forming the first structural layer at the side of the second structural layer facing away from the base substrate, includes:

S10311, forming a first sub-layer 201211 at the side of the second structural layer 20122 facing away from the base substrate 1; and S10312, forming a second sub-layer 201212 at a side of the first sub-layer facing away from the second structural layer 20122.

In some embodiments, before the forming the pattern of the plurality of reflection portions at the side of the base substrate, the method further includes:

forming a planarization layer.

The forming the pattern of the plurality of reflection portions by performing the etching process on the fourth structural layer, the reflection sub-layer and the third structural layer, includes:

forming the pattern of the plurality of reflection portions by performing an over-etching process on the fourth structural layer, the reflection sub-layer and the third structural layer, and removing a part of the planarization layer.

In other words, a part of the planarization layer is removed while performing the etching process on the fourth structural layer, the reflection sub-layer, and the third structural layer, i.e., the pattern of the reflection portions is formed using the over-etching process, so that the residuals of the fourth structural layer, the reflection sub-layer and the third structural layer can be avoided, thereby improving the fabrication yield of the pattern of the reflection portions in the first electrode.

Figure 16:
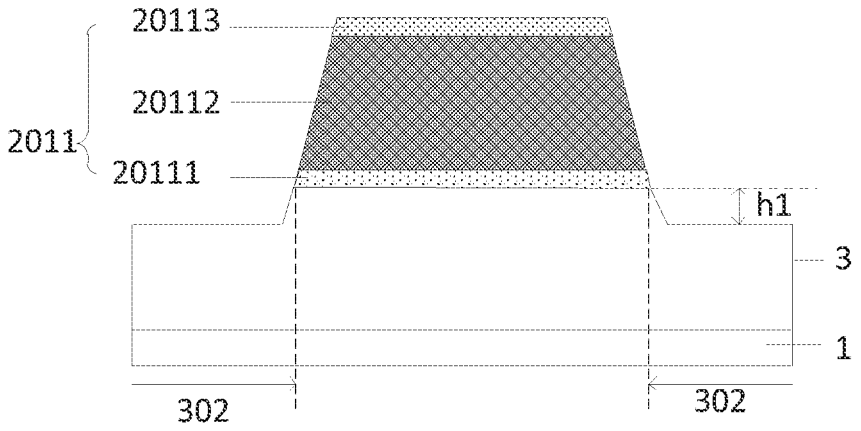
FIG. 16 is a schematic diagram of a structure formed by an over-etching process on a reflection part in a method for preparing a display panel provided by an embodiment of the present application.

In some implementations, the fourth structural layer, the reflection sub-layer, and the third structural layer are subjected to the over-etching process to form the pattern of the plurality of the reflection portions, and a part of the planarization layer is removed as shown in FIG. 16. The region in which the planarization layer 3 is removed is the first region 302. In some implementations, an over-etching depth is, for example, greater than or equal to 200 angstroms and less than or equal to 300 angstroms. That is, a distance h1 between the surface of the first region 302 parallel to the base substrate and a surface of the remaining region parallel to the base substrate is greater than or equal to 200 angstroms and less than or equal to 300 angstroms.

In some implementations, when the reflection portion further includes the first cover layer, the over-etching process is performed on the first cover layer, the fourth structural layer, the reflection sub-layer and the third structural layer.

In some embodiments, after the operation S103 of forming the pattern of the plurality of cover portions at the side of the reflection portions facing away from the base substrate, the method further includes:

forming a first isolation groove structure in a region of the planarization layer between the first electrodes; e.g., the first isolation groove structure being located in the first region; and sequentially forming a pixel-defining layer, a light-emitting functional layer, a second electrode, an encapsulation layer, and color filters at a side of the pattern of the cover portions facing away from the base substrate.

Alternatively, in some embodiments, after the operation S103 of forming the pattern of the plurality of cover portions on the side of the reflection portions facing away from the base substrate, the method further includes:

forming a pattern of a pixel-defining layer at a side of the pattern of the cover portions facing away from the base substrate; where the pixel-defining layer include a second isolation groove structure; and sequentially forming a light-emitting functional layer, a second electrode, an encapsulation layer, and color filters at a side of the pixel-defining layer facing away from the base substrate.

The structures of the pixel-defining layer, the light-emitting functional layer, the encapsulation layer, and the color filters are referred to the embodiments of the display panel, and will not be repeated herein.

Embodiments of the present disclosure provide a display apparatus. The display apparatus includes a display panel provided by the embodiments of the present disclosure.

The display apparatus provided by the embodiments of the present disclosure is any product or component with a display function such as a mobile phone, a tablet computer, a television, a monitor, a notebook computer, a digital photo frame, and a navigator. Other essential components of the display apparatus should be understood by those of ordinary skill in the art, and will not be repeated here, nor should they be used as limitations on the present disclosure. The implementation of the display apparatus can be referred to the embodiments of the above display panel, and the repetition will not be repeated.

In summary, the display panel, the method for preparing the display panel and the display apparatus are provided by embodiments of the present disclosure, the first electrode includes the cover portion that covers the side face of the reflection portion, so as to avoid migration and bulging or corrosion and missing on the side face of the reflection portion, improve the flatness of the front face and the side face of the first electrode, improve the injection efficiency of the first electrode, improve the light-emitting efficiency of the light-emitting device, and thereby to reduce the power consumption of the display panel. Moreover, since the cover portion includes a second structural layer disposed between the first structural layer and the reflection portion, the reflection portion can be blocked from contacting the first structural layer to form an oxide insulating layer, which can thereby avoid affecting the ohmic characteristics of the first electrode and avoid affecting the performance of the light-emitting device.

While preferred embodiments of the invention have been described, additional changes and modifications to these embodiments can be made by those skilled in the art once the basic inventive concept is appreciated. Therefore, it is intended that the appended claims be construed to cover the preferred embodiment as well as all changes and modifications which fall within the scope of the invention.

Apparently, those skilled in the art can make various changes and modifications to the embodiments of the present invention without departing from the spirit and scope of the embodiments of the present invention. In this way, if these modifications and variations of the embodiments of the present invention fall within the scope of the claims of the present invention and their equivalent technologies, the present invention is also intended to include these modifications and variations.

What is claimed is:

1. A display panel, comprising:
a base substrate; and
a plurality of light-emitting devices at a side of the base substrate;
wherein the light-emitting device comprises: a first electrode;
the first electrode comprises:
a reflection portion, and
a cover portion at a side of the reflection portion facing away from the base substrate;
wherein the cover portion covers a front face and a side face of the reflection portion at the side of the reflection portion facing away from the base substrate;
the cover portion comprises:
a first structural layer, and
a second structural layer disposed between the first structural layer and the reflection portion;
wherein the second structural layer is configured to block the reflection portion from contacting the first structural layer.

2. The display panel according to claim 1, wherein the reflection portion comprises:
a third structural layer, a reflection sub-layer and a fourth structural layer stacked at the side of the base substrate;
wherein a thickness of the reflection sub-layer is greater than a thickness of the third structural layer, and the thickness of the reflection sub-layer is greater than a thickness of the fourth structural layer.

3. The display panel according to claim 2, wherein the reflection portion further comprises:
a first cover layer at a side of the fourth structural layer facing away from the reflection sub-layer;
wherein an orthographic projection of the fourth structural layer on the base substrate covers an orthographic projection of the first cover layer on the base substrate.

4. The display panel according to claim 1, wherein the display panel further comprises:
a planarization layer between the base substrate and the light-emitting devices;
wherein the first electrode is at a side of the planarization layer facing away from the base substrate; and
the cover portion comprises a first flat area in contact with the planarization layer.

5. The display panel according to claim 4, wherein the planarization layer comprises:
a first region;
wherein an orthographic projection of the first region on the base substrate is between orthographic projections of adjacent reflection portions on the base substrate;
the first region comprises:
a first surface facing away from the base substrate and parallel to a plane in which the base substrate is located, and
a first side face;
a remaining region of the planarization layer outside of the first region comprises:
a second surface facing away from the base substrate and parallel to the plane in which the base substrate is located;
wherein the first side face connects the first surface and the second surface;
a distance between the first surface and the base substrate is less than a distance between the second surface and the base substrate; and
an orthographic projection of the first flat area on the base substrate is within the orthographic projection of the first region on the base substrate.

6. The display panel according to claim 5, wherein a distance between the first surface and the second surface is greater than a thickness of the first flat area.

7. The display panel according to claim 5, wherein a distance between the first surface and the second surface is less than a thickness of the reflection portion.

8. The display panel according to claim 5, wherein an included angle between the first side face and the first surface is greater than 90°.

9. The display panel according to claim 5, wherein the display panel further comprises:
a plurality of isolation structures;
wherein orthographic projections of the isolation structures on the base substrate overlap with a region between orthographic projections of adjacent first electrodes on the base substrate.

10. The display panel according to claim 9, wherein the isolation structure comprises a first isolation groove structure in the first region; and
an orthographic projection of the first isolation groove structure on the base substrate is between the orthographic projections of the adjacent first electrodes on the base substrate.

11. The display panel according to claim 10, in a direction perpendicular to the base substrate, a depth of the first isolation groove structure is greater than the distance between the first surface and the second surface.

12. The display panel according to claim 10, wherein the display panel further comprises:
a pixel-defining layer;
wherein the pixel-defining layer comprises opening areas corresponding the light-emitting devices one by one, an orthographic projection of the opening area on the base substrate falls within an orthographic projection of the first electrode on the base substrate; and the pixel-defining layer covers an edge of the first electrode; and
a maximum thickness of the pixel-defining layer is less than a maximum thickness of the first electrode.

13. The display panel according to claim 9, wherein the isolation structure comprises a second isolation groove structure;
the display panel further comprises a pixel-defining layer;
the pixel-defining layer comprises the second isolation groove structure; and an orthographic projection of the second isolation groove structure on the base substrate is between the orthographic projections of the adjacent first electrodes on the base substrate; and
the pixel-defining layer further comprises opening areas corresponding to the light-emitting devices one by one, an orthographic projection of the opening area on the base substrate falls within an orthographic projection of the first electrode on the base substrate.

14. The display panel according to claim 13, wherein a maximum thickness of the pixel-defining layer is greater than a maximum thickness of the first electrode.

15. The display panel according to claim 13, wherein the pixel-defining layer comprises:
a first pixel-defining sub-layer, a second pixel-defining sub-layer, and a third pixel-defining sub-layer stacked in a direction perpendicular to the base substrate;

wherein a maximum thickness of the first pixel-defining sub-layer is greater than a maximum thickness of the second pixel-defining sub-layer, and the maximum thickness of the second pixel-defining sub-layer is greater than a maximum thickness of the third pixel-defining sub-layer;

the maximum thickness of the first pixel-defining sub-layer is greater than the maximum thickness of the first electrode;

a depth of the second isolation groove structure is greater than a total thickness of the third pixel-defining sub-layer and the second pixel-defining sub-layer and less than the maximum thickness of the pixel-defining layer; and the third pixel-defining sub-layer comprises a first opening area, the second pixel-defining sub-layer comprises a second opening area; and an orthographic projection of the first opening area on the base substrate falls within an orthographic projection of the second opening area on the base substrate.

16. The display panel according to according to claim 1, wherein an orthographic projection of the first structural layer on the base substrate covers an orthographic projection of the second structural layer on the base substrate.

17. The display panel according to claim 1, wherein the first structural layer comprises:

a first sub-layer covering the reflection portion, and a second sub-layer located at a side of the first sub-layer facing away from the reflection portion;

wherein a thickness of the second sub-layer is greater than a thickness of the first sub-layer.

18. The display panel according to claim 1, wherein an included angle between the side face of the reflection portion and a plane in which the base substrate is located is greater than 0° and less than or equal to 70°.

19. A method for preparing a display panel, comprising:

providing a base substrate;

forming a pattern of a plurality of reflection portions at a side of the base substrate; and forming a pattern of a plurality of cover portions at a side of the reflection portions facing away from the base substrate;

wherein the cover portions cover front faces and side faces of the reflection portions at the side of the reflection portions facing away from the base substrate;

the cover portions comprise:

a first structural layer, and a second structural layer disposed between the first structural layer and the reflection portions;

wherein the second structural layer is configured to block the reflection portions from contacting the first structural layer.

20. A display apparatus, wherein the display apparatus comprises the display panel according to claim 1.

* * * * *